United States Patent
Onal et al.

(10) Patent No.: US 11,393,865 B1
(45) Date of Patent: *Jul. 19, 2022

(54) OPTICAL RECEIVER SYSTEMS AND DEVICES WITH DETECTOR ARRAY COMPRISING A PLURALITY OF SUBSTRATES ALIGNED WITH AN ENCAPSULATION LAYER COMPRISING AN ALIGNMENT STRUCTURE

(71) Applicant: Waymo LLC, Mountain View, CA (US)

(72) Inventors: Caner Onal, Palo Alto, CA (US); Pierre-Yves Droz, Los Altos, CA (US); William McCann, Mountain View, CA (US); Laila Mattos, Dallas, TX (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,502

(22) Filed: Jul. 31, 2019

Related U.S. Application Data

(63) Continuation of application No. 15/294,335, filed on Oct. 14, 2016, now Pat. No. 10,396,117.

(51) Int. Cl.
*H01L 27/146* (2006.01)
*H01L 25/075* (2006.01)
*G01S 7/481* (2006.01)
*G01S 17/10* (2020.01)

(52) U.S. Cl.
CPC ...... *H01L 27/14643* (2013.01); *G01S 7/4816* (2013.01); *H01L 25/0753* (2013.01); *H01L 27/14641* (2013.01); *G01S 17/10* (2013.01)

(58) Field of Classification Search
CPC .......... H01L 27/14643; H01L 25/0753; H01L 27/14641; G01S 7/4816; G01S 17/10
See application file for complete search history.

(56) References Cited

U.S. PATENT DOCUMENTS

| | | | | |
|---|---|---|---|---|
| 4,695,716 | A * | 9/1987 | Tandon | H01L 21/30608 |
| | | | | 250/208.1 |
| 5,303,282 | A * | 4/1994 | Kwasnick | G21K 1/02 |
| | | | | 378/147 |
| 7,101,730 | B2 * | 9/2006 | Bolken | H01L 25/105 |
| | | | | 438/107 |

(Continued)

*Primary Examiner* — Jennifer D Bennett
(74) *Attorney, Agent, or Firm* — McDonnell Boehnen Hulbert & Berghoff LLP

(57) ABSTRACT

The present disclosure relates to optical receiver systems. An example system includes a plurality of substrates disposed in an edge-to-edge array along a primary axis. Each respective substrate of the plurality of substrates includes a plurality of detector elements. Each detector element of the plurality of detector elements generates a respective detector signal in response to light received by the detector element. The plurality of detector elements is arranged with a detector pitch between adjacent detector elements of the plurality of detector elements. Each respective substrate of the plurality of substrates also includes a signal receiver circuit configured to receive the detector signals generated by the plurality of detector elements. The respective substrates of the plurality of substrates are disposed such that the detector pitch is maintained between adjacent detector elements on their respective substrates.

13 Claims, 7 Drawing Sheets

(56) References Cited

U.S. PATENT DOCUMENTS

| | | | |
|---|---|---|---|
| 10,018,726 B2 | 7/2018 | Hall et al. | |
| 10,396,117 B2* | 8/2019 | Onal | H01L 25/0753 |
| 10,613,201 B2 | 4/2020 | Pacala et al. | |
| 2002/0153492 A1* | 10/2002 | Sekine | G01T 1/2018 |
| | | | 250/370.11 |
| 2003/0234343 A1* | 12/2003 | Cok | H01L 27/3293 |
| | | | 250/208.1 |
| 2004/0017224 A1* | 1/2004 | Turner | H03F 3/087 |
| | | | 327/51 |
| 2004/0183081 A1* | 9/2004 | Shishov | H01L 33/58 |
| | | | 257/79 |
| 2006/0189062 A1* | 8/2006 | Deng | B29D 11/00278 |
| | | | 438/201 |
| 2011/0175219 A1* | 7/2011 | Cellura | H01L 25/0655 |
| | | | 257/723 |
| 2012/0287417 A1* | 11/2012 | Mimeault | G01S 17/42 |
| | | | 356/5.01 |
| 2016/0104696 A1* | 4/2016 | LaVeigne | H01L 27/14649 |
| | | | 257/88 |

* cited by examiner

Back View

Axial Elevation View

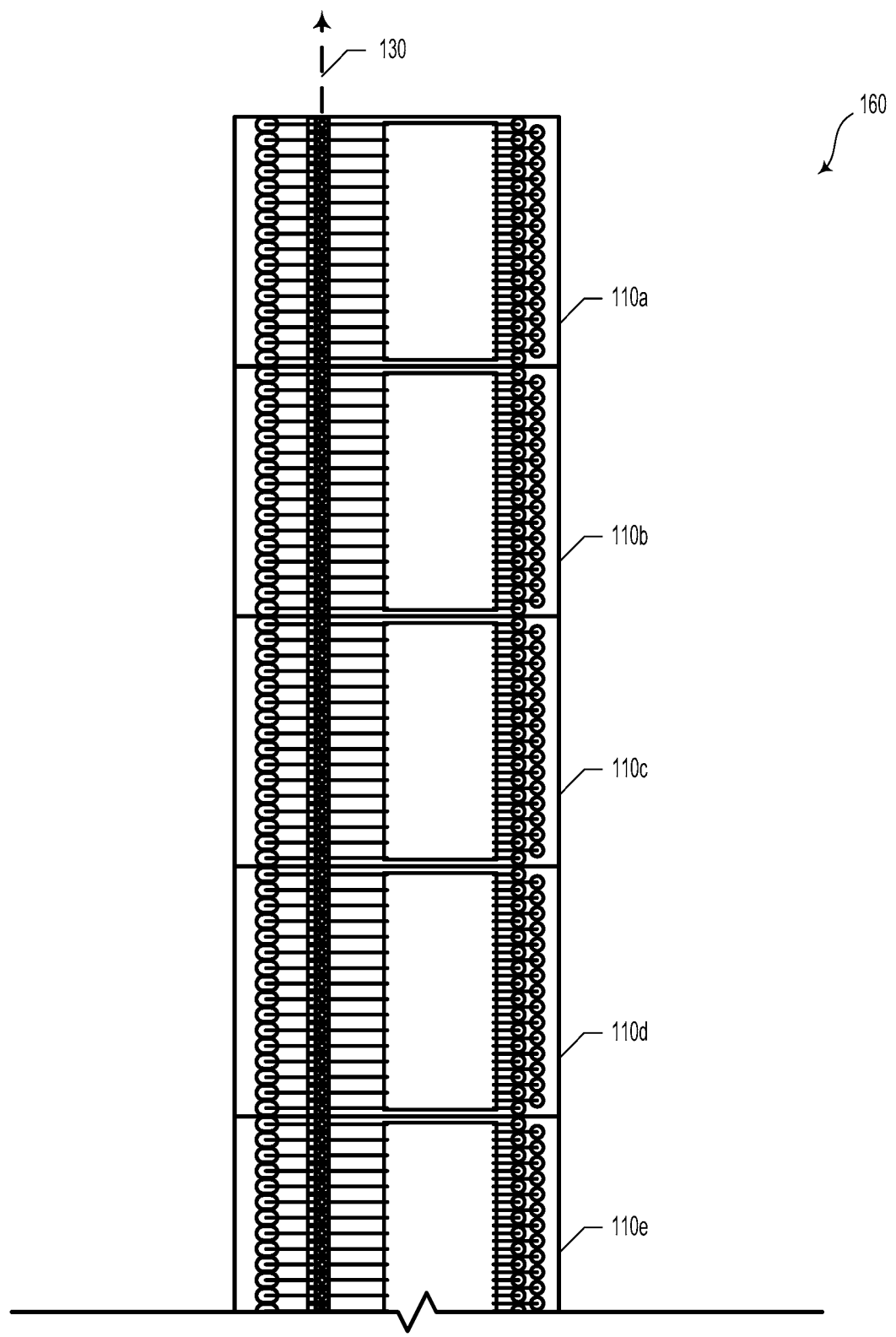
Figure 1C — Top View

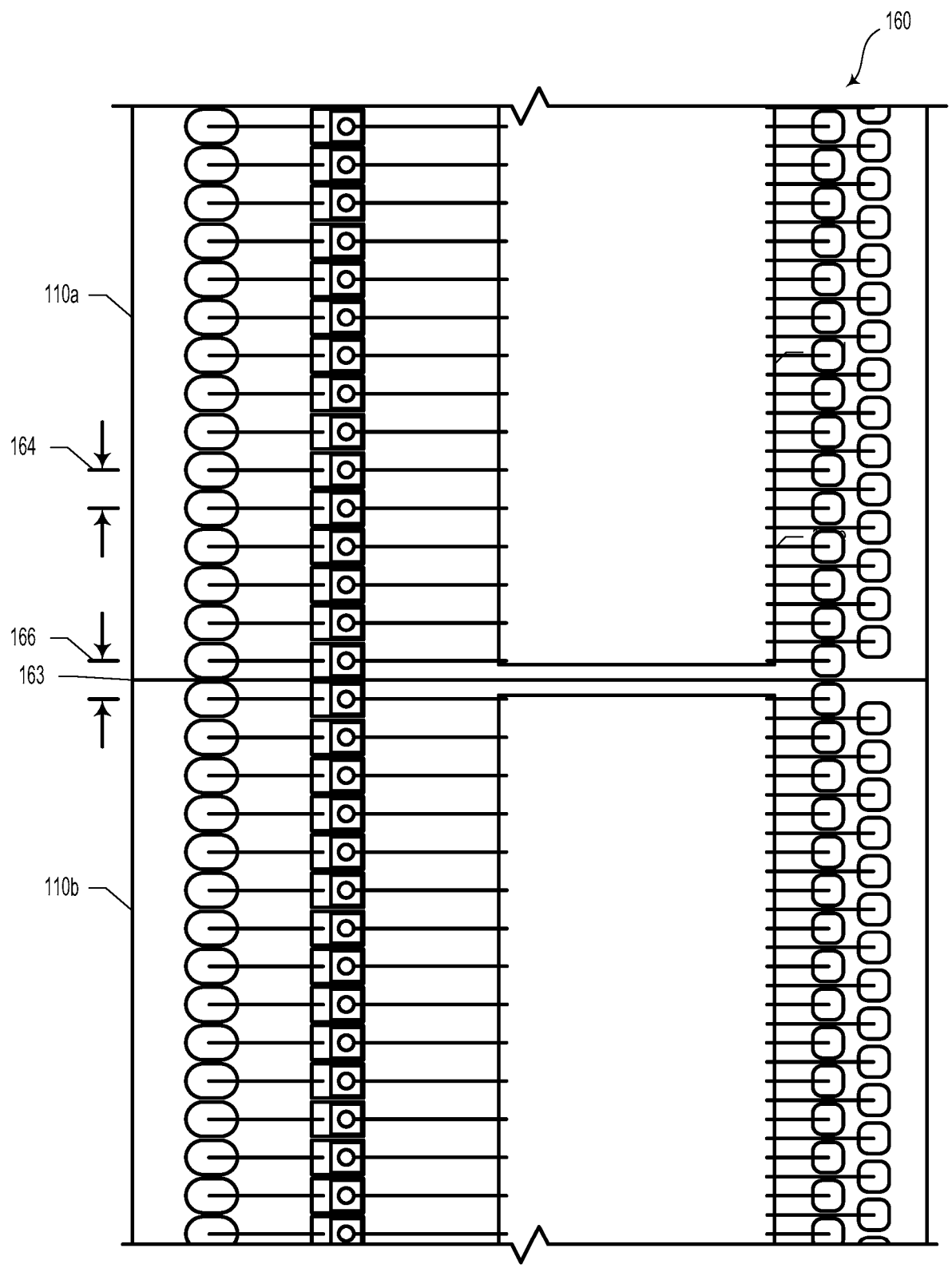
Figure 1D　　　Top View

Axial Elevation View

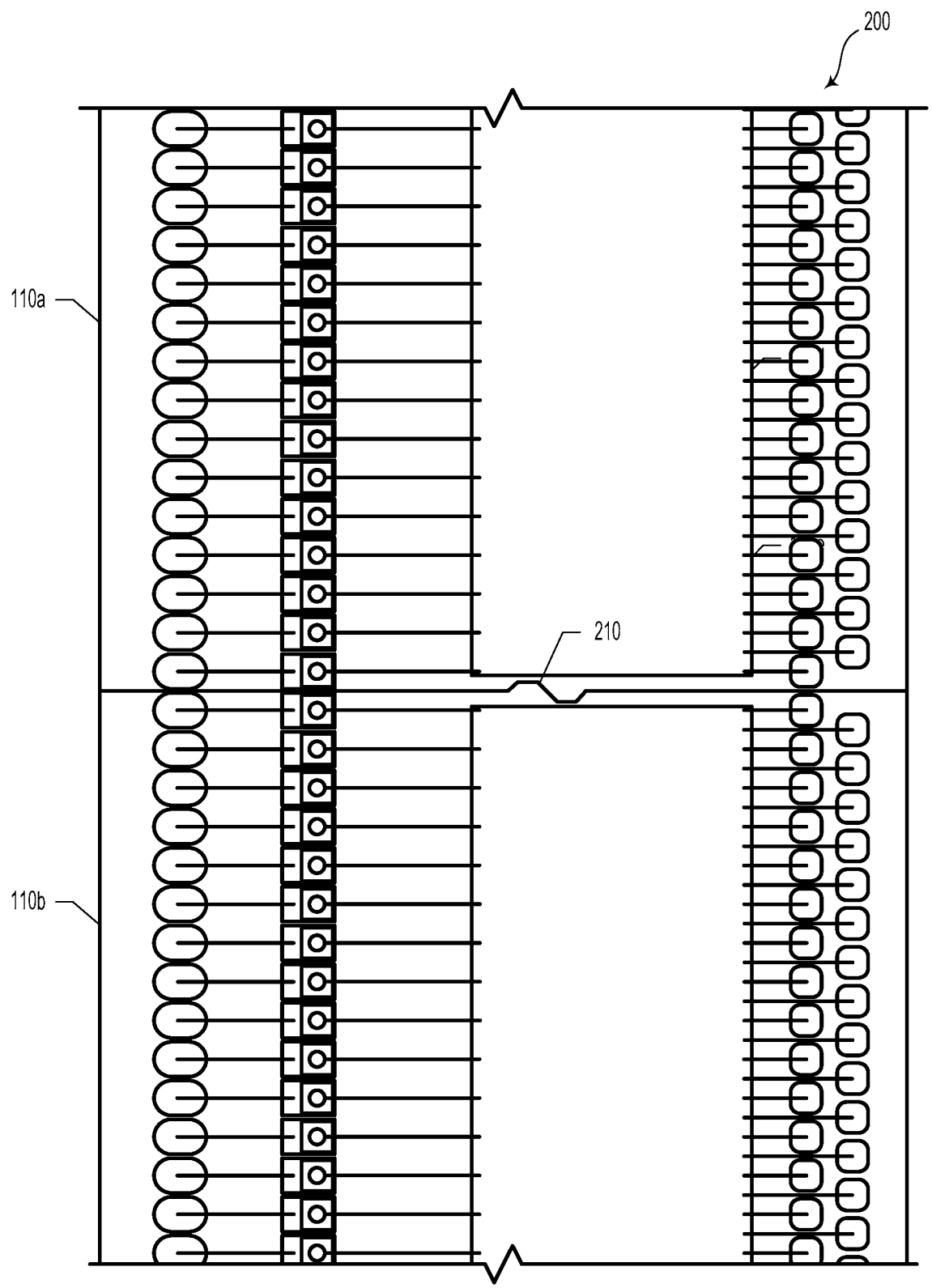
Figure 2A  Top View

Axial Elevation View

OPTICAL RECEIVER SYSTEMS AND DEVICES WITH DETECTOR ARRAY COMPRISING A PLURALITY OF SUBSTRATES ALIGNED WITH AN ENCAPSULATION LAYER COMPRISING AN ALIGNMENT STRUCTURE

CROSS-REFERENCE TO RELATED DISCLOSURES

This application is a continuation of and claims priority to U.S. patent application Ser. No. 15/294,335, titled "Receiver Array Packaging," filed Oct. 14, 2016, which is hereby incorporated by reference in its entirety.

BACKGROUND

Unless otherwise indicated herein, the materials described in this section are not prior art to the claims in this application and are not admitted to be prior art by inclusion in this section.

Photodetectors can detect light within a specific spectral band or at one or more wavelengths of light. An array of photodetectors may be used to image a field of view of a scene. Some photodetector arrays are one-dimensional (1×N) or two-dimensional (A×B). Some photodetector arrays are constrained due to substrate and package size limitations.

SUMMARY

The present disclosure generally relates to an optical receiver system with a detector array that spans multiple substrates. Each portion of the detector array may have a respective read-out integrated circuit and/or other circuitry.

In a first aspect, a system is provided. The system includes a plurality of substrates disposed in an edge-to-edge array along a primary axis. Each respective substrate of the plurality of substrates includes a plurality of detector elements. Each detector element of the plurality of detector elements generates a respective detector signal in response to light received by the detector element. The plurality of detector elements is arranged with a detector pitch between adjacent detector elements of the plurality of detector elements. Each respective substrate also includes a signal receiver circuit configured to receive the detector signals generated by the plurality of detector elements. The respective substrates of the plurality of substrates are disposed such that the detector pitch is maintained between adjacent detector elements on their respective substrates.

In a second aspect, an optical receiver device is provided. The optical receiver device includes a plurality of substrates disposed in an edge-to-edge array along a primary axis. Each respective substrate of the plurality of substrates includes a plurality of detector elements disposed along a first surface of the respective substrate. The plurality of detector elements is arranged with a detector pitch between adjacent detector elements of the plurality of detector elements. Each detector element of the plurality of detector elements generates a respective detector signal in response to light received by the detector element. Each respective substrate of the plurality of substrates also includes a ball grid array (BGA) or a land grid array (LGA) disposed along a second surface of the respective substrate. The second surface is opposite the first surface. Each respective substrate of the plurality of substrates additionally includes a signal receiver circuit configured to receive the detector signals generated by the plurality of detector elements. The respective substrates of the plurality of substrates are disposed such that the detector pitch is maintained between adjacent detector elements on their respective substrates.

Other aspects, embodiments, and implementations will become apparent to those of ordinary skill in the art by reading the following detailed description, with reference where appropriate to the accompanying drawings.

BRIEF DESCRIPTION OF THE FIGURES

FIG. 1C illustrates a system, according to an example embodiment.

FIG. 1D illustrates a system, according to an example embodiment.

FIG. 2A illustrates an optical receiver device, according to an example embodiment.

DETAILED DESCRIPTION

Figure 1A:
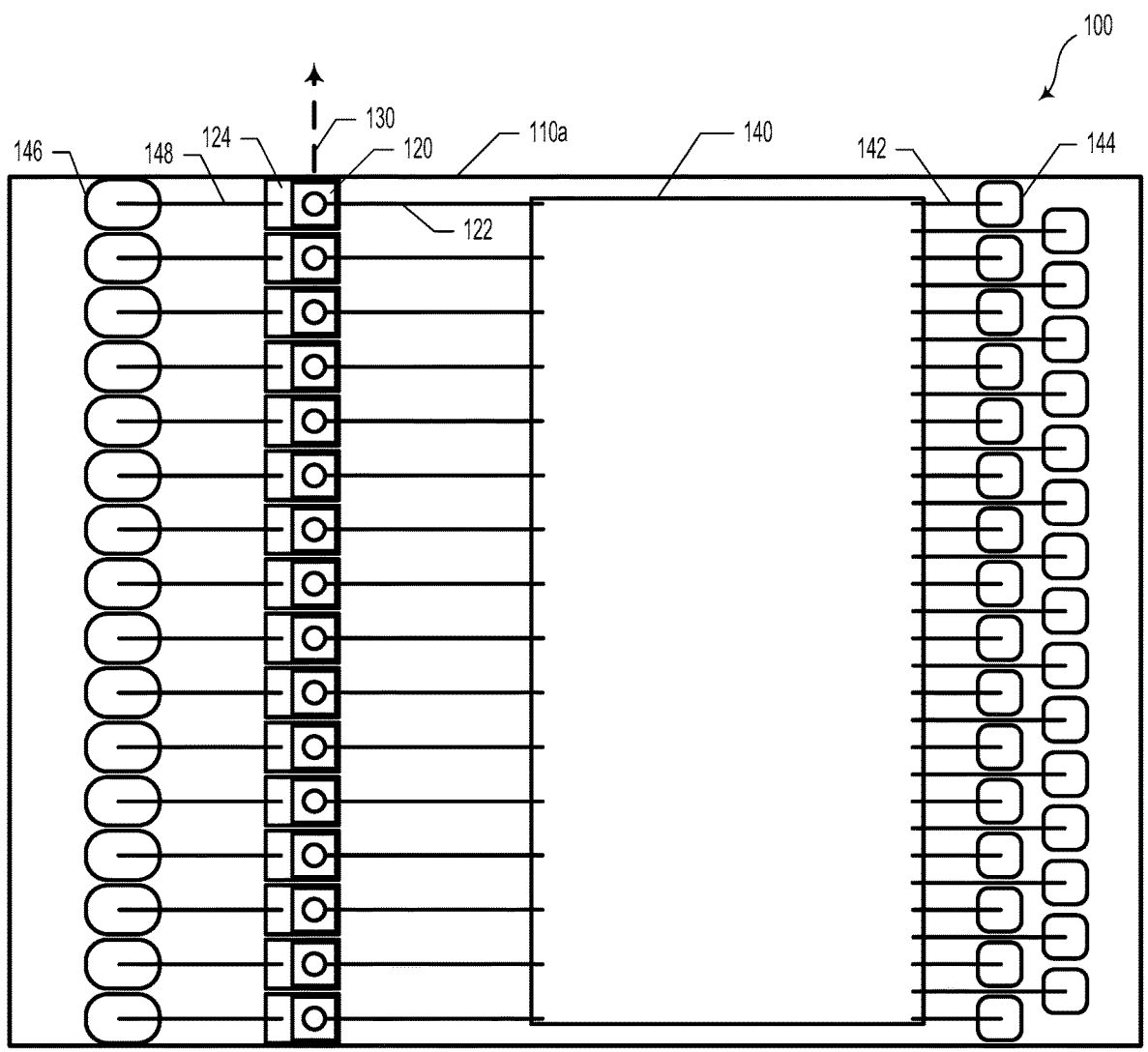
FIG. 1A illustrates a system, according to an example embodiment.
Figure 1A:
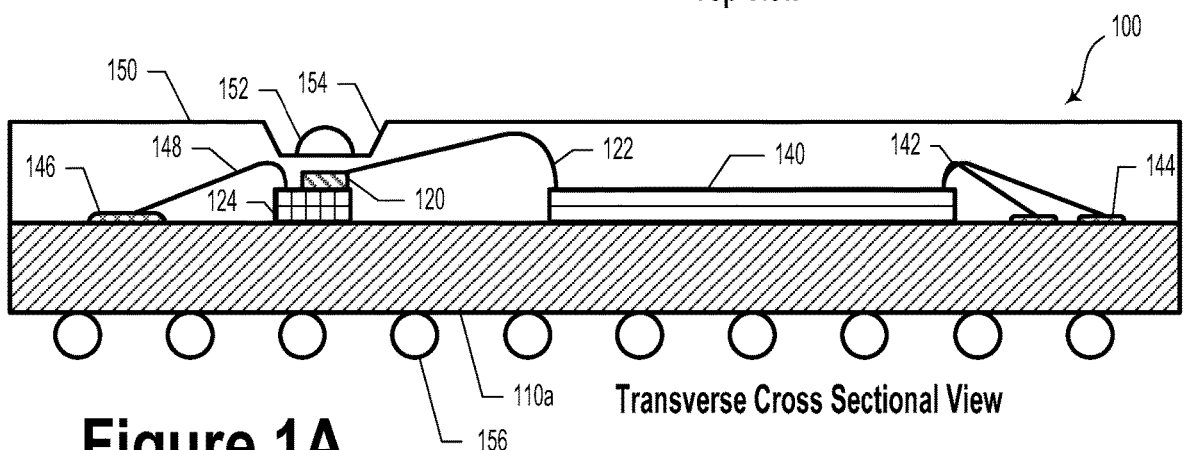

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

An optical receiver system may include a plurality of substrates arranged in an array. Each substrate may include a plurality of detector elements coupled to a signal receiver circuit. In an example embodiment, the signal receiver circuit may include an application-specific integrated circuit (ASIC) and/or a field-programmable gate array (FPGA). For example, the signal receiver circuit may include an amplifier configured to receive photosignals from the detector elements.

In some embodiments, the plurality of detector elements may include 16 detector elements arranged along an axis parallel to a surface of the substrate. The detector elements may include avalanche photodiodes (APDs), such as single photon avalanche diodes (SPADs). In an example embodiment, the APDs may be operated in linear mode and/or in Geiger mode. In some cases, the axis may be perpendicular to at least one edge of the substrate. Furthermore, the plurality of substrates may be arranged in an end-to-end (or edge-to-edge) fashion such that a detector pitch (e.g., distance from detector centers) is constant, even between detector elements arranged on different substrates. As an example, 13 substrates with respective sets of detectors may be arranged in a row such that all 208 detectors are aligned in a single row. In other words, the substrates may be diced, etched, or otherwise formed such that each substrate and detector arrangement is essentially "borderless" at least along the detector axis. In such a scenario, the "long line" arrangement of detector elements may provide high resolution along at least one scanning axis of a light detection and ranging (LIDAR) system.

In an example embodiment, the detectors may be arranged along a first side of the substrate. A second side of the substrate may include a ball grid array (BGA). Accordingly, the substrate may be electrically coupled to a power supply and/or other electronic components.

In some embodiments, each detector is wire bonded to a respective signal receiver circuit. Furthermore, for each detector/signal receiver circuit wire bond (e.g., sixteen wire bonds per substrate), a return wire bond may be made from the bond pad on the signal receiver circuit to a ground plane on the substrate. The return wire bonds and the detector/signal receiver circuit wire bonds may be arranged such that the wire loop areas (e.g., cross-sectional inductive loop area) are similar or identical. Such an arrangement may eliminate or reduce some parasitic capacitive or inductive coupling due to the wire bonds.

The substrate, detectors, and wire bonds may be encapsulated with an encapsulation material. In some embodiments, the encapsulation material may be applied via a transfer mold process. However, other processes for applying the encapsulation material are contemplated (e.g., deposition, injection molding, reflow, backfill, etc.). The encapsulation material may be registered (e.g., via fiducial marks on the substrate) with the detector elements. In an example embodiment, the encapsulation material may include epoxy, silicone, or other polymer. Other encapsulation materials are possible. The encapsulation material may be applied or fabricated such that it has varying depth with respect to a surface of the substrate. For instance, the encapsulation may be thinner (e.g., may form a trench or depression) over the respective detectors. In a specific example, the encapsulation proximate to each detector may include an 800 micron wide trench with a 60-degree sidewall profile.

The local area of the encapsulation above the respective detectors may include one or more microlenses. That is, each detector may receive light via a respective microlens formed in the encapsulation material. The microlenses may be hemispherical, although other shapes are possible. In some embodiments, the microlenses may be formed with the encapsulation material. However, the microlenses may include other shapes and materials. In some embodiments, the microlenses may include pre-molded lens elements. In such scenarios, the pre-molded microlenses may be positioned via pick and place system or another precision placement method.

The microlenses may provide collection of light from a wide range of incidence angles. In some embodiments, the microlenses may be offset by 200 microns with respect to a surface of the detectors. Also, the microlenses may be recessed with respect to a primary surface of the encapsulation material (i.e., a surface where the encapsulation material is thickest). In a specific example, the microlenses may have a diameter greater than at least one physical dimension of the respective detector and/or the detector pitch. For instance, the microlens may have a diameter of 440 microns with a 400 micron pitch. As such, the microlenses may be "clipped" along at least one side. However, other geometries are possible. In some example embodiments, the shape of the microlens may be based on an optical path of incident light (e.g., f-number of other collection/focusing optics).

II. Example Systems

FIG. 1A illustrates a system 100, according to an example embodiment. System 100 includes a substrate 110a and a plurality of detector elements 120. System 100 also includes a signal receiver circuit 140, signal bond wires 142, signal pads 144, and ground pads 146.

Substrate 110a may be a semiconductor material such as silicon or gallium arsenide. In some embodiments, the substrate 110a may include InGaAs grown on an InP substrate. It will be understood that other substrate materials are possible. Additionally or alternatively, substrate 110a may include a printed circuit board (PCB) or another substrate material. In some embodiments, substrate 110a may be a flexible substrate.

The detector elements 120 are configured to detect light within a desired spectral range and/or at one or more wavelengths. In an example embodiment, the detector elements 120 may be configured to detect light at 1550 nm, however, other wavelengths and/or spectral ranges are possible. In an example embodiment, at least one of the detector elements 120 could be an avalanche photodiode (APD) or a single photon avalanche diode (SPAD). For example, detector element 120 may include an InGaAs APD configured to detect light at wavelengths around 1550 nm. Other types of photodetectors are possible and contemplated herein.

Each detector element of the plurality of detector elements 120 may be die-bonded to a respective capacitor 124. The capacitor device 124 may provide low-pass signal filtering. The capacitor device 124 may be die-bonded to the substrate 110a. In an example embodiment, the capacitor device 124 may be a tantalum or aluminum capacitor. In some embodiments, a ground return bond 148 may be connected from the respective capacitor devices 124 to a respective ground pad 146.

In an example embodiment, the signal receiver circuit 140 may include at least one of an application-specific integrated circuit (ASIC) or a field-programmable gate array (FPGA), such as a Xilinx XCVU3P Virtex UltraScale+FPGA. For instance, the signal receiver circuit 140 may represent an amplifier or another type of analog front end system configured to receive respective photosignals from the plurality of detector elements 120. As an example, a detector element may provide a respective photosignal to the signal receiver circuit 140 via wire bond 122. In an example embodiment, the ground return bonds 148 and the detector/signal receiver circuit wire bonds 122 may be arranged such that the wire loop areas (e.g., cross-sectional inductive loop area) are similar or identical. Such an arrangement may eliminate or reduce some parasitic capacitive or inductive coupling due to the wire bonds.

The signal receiver circuit 140 may receive and amplify the respective photosignals from the plurality of detector elements 120. The signal receiver circuit 140 may carry out a variety of other functions including, but not limited to, signal routing/selection (e.g., switch, multiplexer, or demultiplexer), and signal processing (e.g., denoising, decoding, or encoding). The signal receiver circuit 140 may additionally or alternatively be configured to provide various image processing tasks based on the received photosignals (e.g., time averaging).

In an example embodiment, the signal receiver circuit 140 could include a transimpedance amplifier (TIA), such as a Maxim MAX 3658 low noise TIA. In other embodiments, the TIA may be embedded in a custom ASIC.

In an example embodiment, the plurality of detector elements 120 may include sixteen detector elements arranged in a single column (e.g., a linear array). For example, the detector elements of the plurality of detector elements 120 could be arranged along, or could be at least parallel to, a primary axis 130. It will be understood that other arrangements of the respective detector elements are possible. For instance, the detector elements could be arranged in two columns that are parallel to primary axis 130. While FIG. 1A illustrates sixteen detector elements, more or fewer detector elements are contemplated.

In an example embodiment, each detector element could be substantially square with a 350 micron side length. Furthermore, the detector pitch could be 400 microns along the primary axis 130. That is, a center-to-center distance between neighboring detector elements could be 400 microns. Put another way, assuming a 350 micron detector side length, when arranged along the primary axis 130, the detector elements may have 50 microns between them. It will be understood that other values for the detector pitch are possible and contemplated. For example, with smaller detector elements, detector pitches of less than 50 microns are possible.

In an example embodiment, during back end of line (BEOL) processing, the substrate 110*a* may be diced within 25 microns of an outermost detector element. In such a situation, another substrate similar to that of system 100 may be arranged right next to system 100 to maintain identical detector pitch across the different substrates.

As shown in the transverse cross sectional view of FIG. 1A, in some embodiments, the system 100 may include an encapsulation 150 overlaying at least the plurality of detector elements 120. The encapsulation 150 may include an epoxy or silicone. In some embodiments, the encapsulation 150 may include Sil-Poxy silicone adhesive, SolEpoxy OP7200, Nitto NT-324H, Nuva-Sil Epoxy resin, or silica. While a variety of application methods are contemplated, in an example embodiment, the encapsulation 150 may be provided using a one- or two-step transfer mold process. In an embodiment, the transfer mold may be registered to substrate with a fiducial mark on the substrate 110*a*, or another type of alignment feature or landmark.

The encapsulation 150 may include a trench portion 154 that may be disposed above the plurality of detector elements 120. In an example embodiment, the trench portion 154 could have sidewalls with a 60 degree sidewall angle. In some embodiments, the trench portion 154 may provide some measure of detector isolation from neighboring devices. For example, in some embodiments, optical crosstalk may be reduced below −30 dB. As an illustrative example, the trench portion 154 may be 800 microns in width (measured from an opening of the trench). It will be understood that other trench profiles (e.g., depth, width, sidewall angle) are contemplated. Specifically, trench profiles may be selected in an effort to reduce optical crosstalk between neighboring detectors.

In an example embodiment, the encapsulation 150 proximate to each detector element of the plurality of detector elements 120 may include a microlens 152. In an example embodiment, the microlens 152 may have a hemispherical shape, although other shapes are contemplated. Further, the hemispherical microlens 152 may have a diameter that is larger than a size of the detector. For example, with a square detector having a 350 micron side length, the hemispherical microlens 152 could have a diameter of 440 microns. It will be understood that the dimensions and/or shape of the microlens 152 may be selected based on an incident optical beam (e.g., from a given field of view). For example, the microlens 152 may be adjusted based on a predetermined f-number of the optical system and/or other characteristics of the optical system.

The encapsulation 150 may magnify the active area and may also protect the system 100 from scratches and other damage. For example, the encapsulation 150 may provide protection for wirebonds and may be substantially optically clear within the wavelengths of interest.

In some embodiments, the microlens 152 is recessed with respect to a primary surface 151 of the encapsulation 150. In this way, the microlens 152 may be better protected against physical damage.

In some embodiments, the plurality of detector elements 120 may be disposed along a first surface (e.g., the top) of the substrate 110*a* and a ball grid array 156 (BGA) may be disposed along a second, opposite surface of the substrate 110*a*. Among other possibilities, the ball grid array 156 may provide one or more electrical interconnects to other electrical systems, devices, and/or elements. For example, the substrate 110*a* may be electrically coupled to a power supply and/or other electronic components (e.g., a read-out integrated circuit (ROIC)) via BGA 156.

While a ball grid array is described and illustrated with regard to system 100, other interconnect types are contemplated. For example, substrate 110*a* could alternatively or additionally include a pin grid array and/or be compatible with a land grid array.

While the system 100 could be used for many different applications, system 100 could represent at least a portion of a receiver of a light detection and ranging (LIDAR) system. That is, system 100 could be used to receive return laser pulses from a field of view of the LIDAR system. As such, system 100 may provide a "border-less" carrier substrate, which may provide more efficient returns from a vertically-scanning LIDAR beam.

Figure 1B:
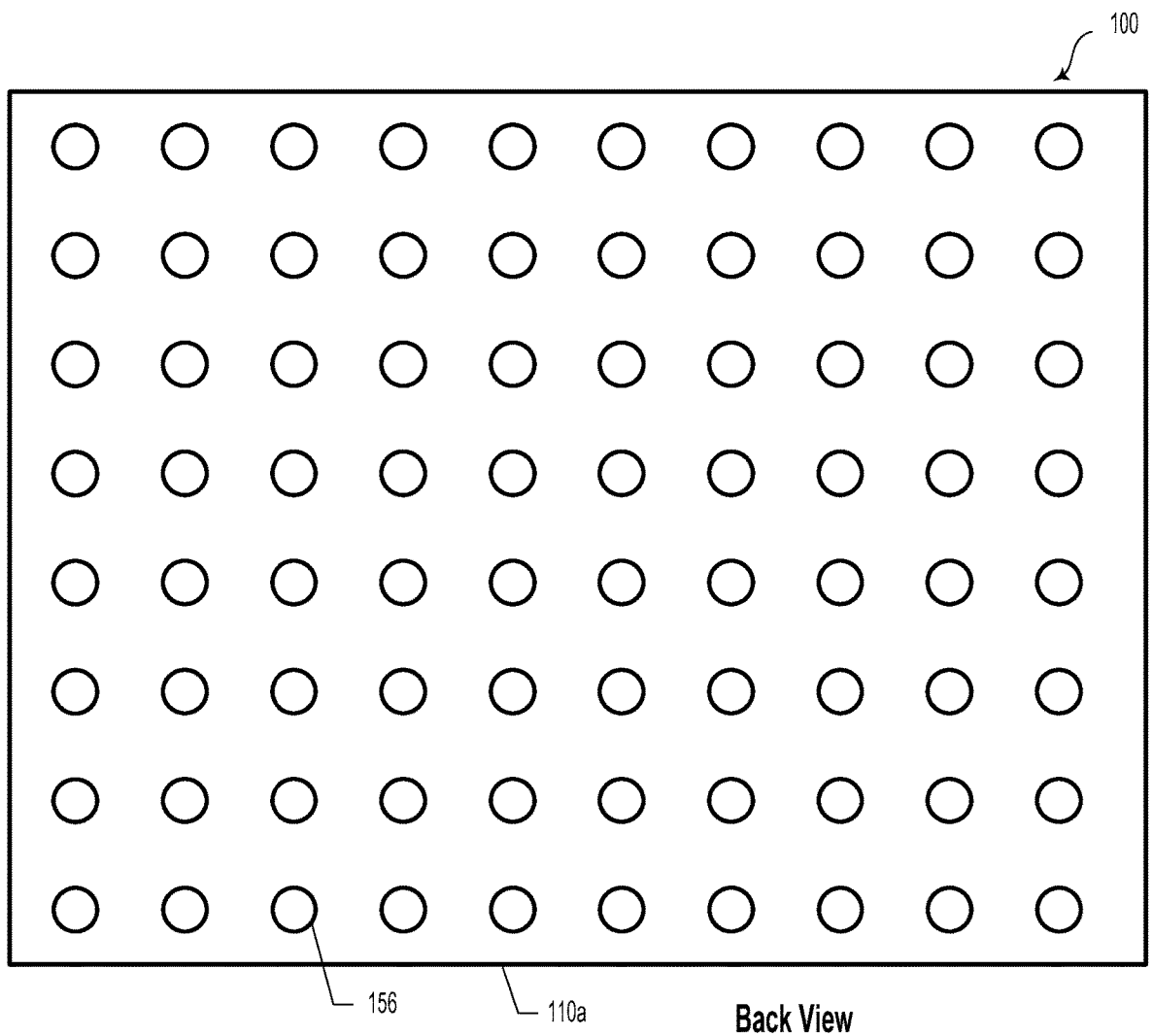
FIG. 1B illustrates a system, according to an example embodiment.
Figure 1B:
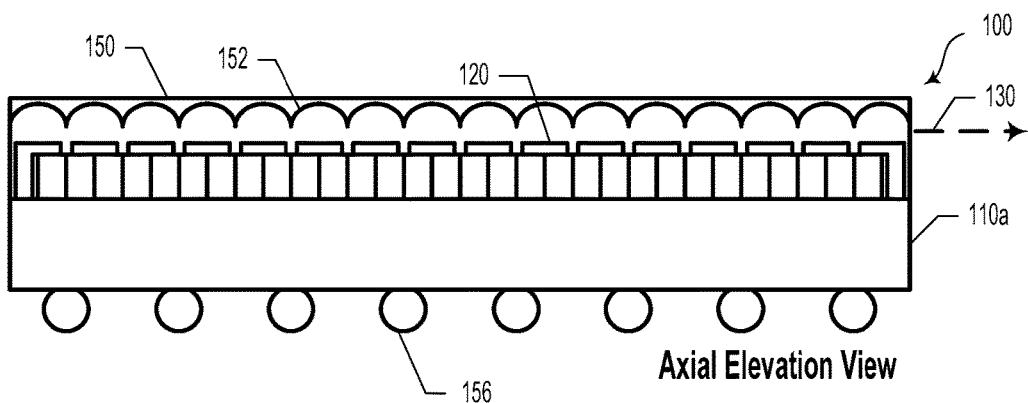

FIG. 1B illustrates the system 100, according to an example embodiment. As illustrated in the Back View, substrate 110*a* of system 100 may include a ball grid array 156.

Furthermore, as illustrated in the Axial Elevation View of FIG. 1B, the encapsulation 150 may include a plurality of microlenses 152. In an example embodiment, the microlenses 152 may be substantially centered over the respective detector elements. Furthermore, each of the microlenses 152 may have a diameter of 440 microns. As such, if the detector pitch is 400 microns, the microlenses 152 may be "clipped" along the primary axis 130.

While microlenses 152 are illustrated and described herein as having a hemispherical shape, it will be understood that other shapes and lens types are possible and contemplated. For example, the microlenses 152 may be formed from micro-Fresnel lenses, which may focus light by refraction in a set of concentric curved surfaces. Yet further, microlenses 152 may be formed from binary optics. Such binary optical lenses may resemble a stepped arrangement.

FIG. 1C illustrates a system 160, according to an example embodiment. System 160 may include a plurality of substrates 110a-110e, etc. that may be disposed in an edge-to-edge array along the primary axis 130. As described elsewhere herein, the respective substrate 110a-e may be diced within 25 microns of an outermost detector element (e.g., detector 1 and detector 16). As such, the respective substrates 110a-e may be arranged next to one another while maintaining identical detector pitch (e.g., 400 microns) and identical detector spacing (e.g., 50 microns) across the different substrates.

In an example embodiment, system 160 may include thirteen substrates (e.g., 110a-m) disposed in an edge-to-edge array along the primary axis 130. System 160 may include more or fewer substrates. Furthermore, other geometries are contemplated. For example, a plurality of substrates could be disposed in an edge-to-edge array in two-dimensions (e.g., along an x-axis and a y-axis.)

FIG. 1D illustrates a system 160, according to an example embodiment. Namely, FIG. 1D provides a detail view of the interface between substrate 110a and substrate 110b. In an example embodiment, substrate 110a and substrate 110b may be etched, wafer sawed or otherwise processed such that when abutted against one another, their respective detector arrays may maintain a constant detector spacing (e.g., detector pitch).

In other words, for a given detector pitch 164, substrates 110a and 110b could be arranged along interface 163 such that an inter-substrate detector pitch 166 is substantially identical to the "on-chip" detector pitch 164. In some embodiments, the inter-substrate detector pitch 166 could differ by less than 1% or less than 5% from the detector pitch 164. As used herein, "substantially identical" may be a difference between the inter-substrate detector pitch 166 and the detector pitch 164 that still permits full operation of the plurality of detector elements as an extended optical detector array.

Figure 1E:
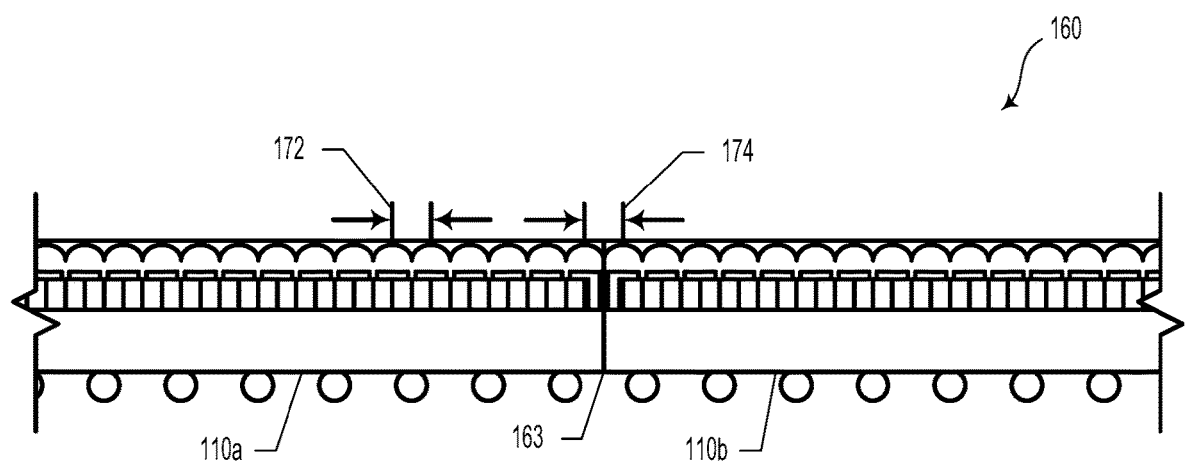
FIG. 1E illustrates a system, according to an example embodiment.

FIG. 1E illustrates a system 160, according to an example embodiment. FIG. 1E provides a detail axial elevation view of the interface between substrate 110a and 110b. For a given on-substrate detector pitch 172 (e.g., 400 microns), substrates 110a and 110b may be arranged such that an inter-substrate detector pitch 174 is substantially identical to detector pitch 172. In some embodiments, the inter-substrate detector pitch 174 could differ by less than 1% or less than 5% from the detector pitch 172.

In an example embodiment, any of the systems described herein may form part of an optical receiver device. That is, systems 100 and 160 may make up at least a portion of an optical receiver device. In such a scenario, the optical receiver device may include a plurality of substrates disposed in an edge-to-edge array along a primary axis. Each respective substrate of the plurality of substrates may include a plurality of detector elements disposed along a first surface of the respective substrate. Each detector element of the plurality of detector elements is disposed according to a detector pitch. Each respective substrate may also include a ball grid array (BGA) or a land grid array (LGA) disposed along a second, opposite, surface of the respective substrate and a signal receiver circuit configured to receive respective photosignals from the plurality of detector elements. The respective substrates of the plurality of substrates are disposed such that the detector pitch is maintained between adjacent detector elements on their respective substrates.

Figure 2B:
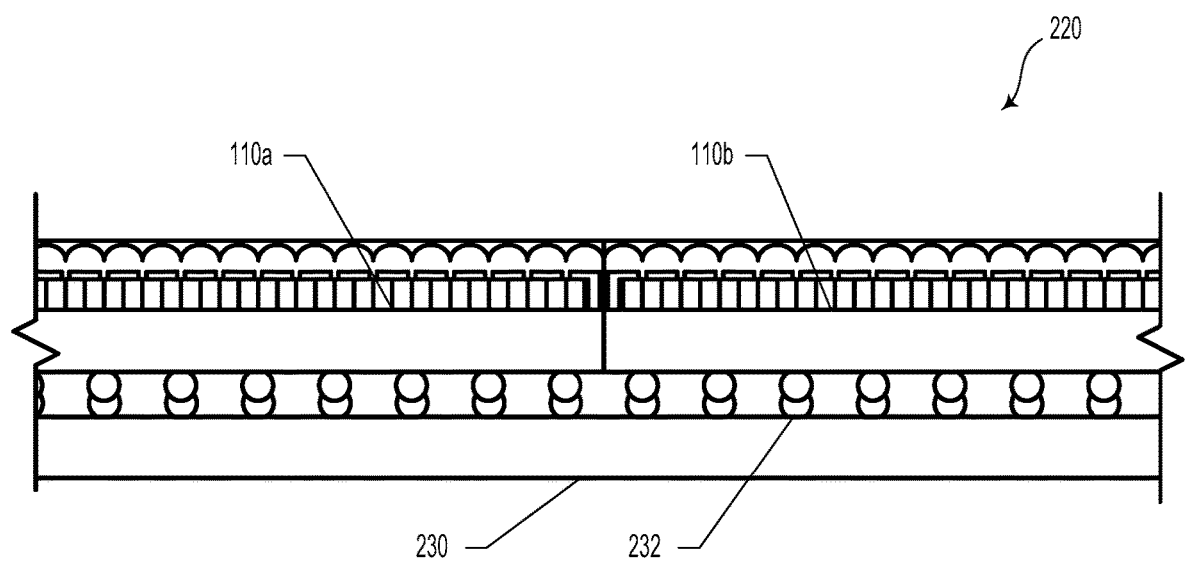
FIG. 2B illustrates an optical receiver device, according to an example embodiment.

In an example embodiment, the plurality of substrates may be aligned relative to one another via a variety of methods, as illustrated in FIGS. 2A and 2B. FIG. 2A illustrates an optical receiver device 200. Optical receiver device 200 may be similar or identical to systems 100 and 160, as illustrated and described with regard to FIGS. 1A-E. In such a scenario, each substrate (110a and 110b) may include one or more alignment structures 210. As an example, the alignment structures 210 could be one or more slots and/or tabs configured to provide lateral alignment between the substrates 110a and 110b when fit together in an edge-to-edge fashion. In some embodiments, the alignment structures 210 may be incorporated into the encapsulation layer. For instance, one or more extruded, spherical shapes may be formed in the encapsulation layer of each of the plurality of substrates. During a mechanical alignment process, the plurality of substrates may be aligned to one another by fitting the spherical shapes of each encapsulation layer into a common mating surface that may have corresponding mating features (e.g., embossed spherical shapes) at appropriate intervals.

FIG. 2B illustrates an optical receiver device 220, according to an example embodiment. Optical receiver device 220 may be similar or identical to systems 100 and 160, as illustrated and described with regard to FIGS. 1A-E. Optical receiver device 220 may include a flexible or rigid base substrate 230. As an example, the base substrate 230 may be a printed circuit board. In one embodiment, the printed circuit board could be a flexible printed circuit board. The base substrate 230 may include alignment structures, such as solder balls 232, contact pads, or other types of physical and/or electrical coupling structures. That is, the base substrate 230 may provide an extended mating surface for the plurality of substrates (including substrates 110a and 110b). The plurality of substrates may be mated with the base substrate 230 via a bonding process (e.g., bump bonding), physical coupling, gluing, and pick-and-place methods, among others. When mated with the base substrate 230, the plurality of substrates may be substantially aligned in one or more directions (e.g. height and/or lateral position).

While FIG. 2B illustrates the base substrate 230 as being substantially flat, it is understood that the base substrate 230 may include a concave or convex shape such that the plurality of substrates (e.g., 110a and 110b) may be oriented along the concave or convex shape. In an example embodiment, the base substrate 230 may be a rigid or flexible substrate having a curved shape corresponding to a focal plane and/or a field curvature. That is, the base substrate 230 may be shaped according to a field curvature (e.g., a Petzval field curvature) of an optical system.

In an example embodiment, the optical receiver device may be configured to receive LIDAR laser pulses. Additionally or alternatively, the optical receiver device may include at least 13 substrates. In such a scenario, a total number of detector elements, N, may be at least 208.

As described herein, the detector elements may be disposed in a linear array. As an example, the linear array may include a 1×N array of detector elements oriented parallel to the primary axis. In some embodiments, the detector pitch of the linear detector array is less than 500 microns. While some embodiments herein are described as having a linear array format, it is understood that 2-dimensional arrays are also contemplated. In such scenarios, the 2-D array may include M×N detector elements.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
   a plurality of substrates disposed in an edge-to-edge array along a primary axis, wherein each respective substrate of the plurality of substrates comprises:
      a plurality of detector elements, wherein each detector element of the plurality of detector elements generates a respective detector signal in response to light received by the detector element;
      a signal receiver circuit configured to receive the detector signals generated by the plurality of detector elements; and
      an encapsulation overlaying at least the plurality of detector elements, wherein the encapsulation comprises an alignment structure configured to provide lateral alignment between respective substrates of the plurality of substrates.

2. The system of claim 1, wherein the edge-to-edge array comprises a linear array, wherein the linear array comprises the plurality of substrates being disposed along the primary axis.

3. The system of claim 1, wherein the signal receiver circuit comprises at least one of an application-specific integrated circuit (ASIC) or a field-programmable gate array (FPGA).

4. The system of claim 1, wherein the signal receiver circuit comprises an amplifier.

5. The system of claim 1, wherein the plurality of detector elements comprises at least 16 detector elements disposed parallel to the primary axis.

6. The system of claim 1, wherein the plurality of detector elements comprises at least one of an avalanche photodiode (APD) or a single photon avalanche diode (SPAD).

7. The system of claim 1, wherein each detector element of the plurality of detector elements is coupled, via at least one wire bond, to the signal receiver circuit.

8. The system of claim 1, wherein each respective substrate has a first surface on which the plurality of detector elements is disposed and a second surface on which a ball grid array (BGA) is disposed, wherein the second surface is opposite the first surface.

9. The system of claim 1, wherein the encapsulation comprises a plurality of microlenses, wherein each microlens of the plurality of microlenses is proximate a respective detector element of the plurality of detector elements.

10. The system of claim 9, wherein the respective detector elements of the plurality of detector elements are separated by a detector pitch, wherein each microlens comprises a hemisphere having a diameter and is proximate a respective detector element having an edge length, wherein the diameter is greater than a combination of the edge length and the detector pitch, and wherein each microlens is recessed with respect to a primary surface of the encapsulation defined by a thickest portion of the encapsulation.

11. The system of claim 1, wherein the system is at least a portion of a receiver of a light detection and ranging (LIDAR) system.

12. The system of claim 1, further comprising a common mating surface of the plurality of substrates, wherein the alignment structure comprises a plurality of mating features configured to fit into corresponding alignment structures of the common mating surface to align the respective substrates of the plurality of substrates.

13. The system of claim 1, further comprising a base substrate connected to the plurality of substrates, wherein the base substrate is shaped according to a field curvature, and wherein each of the plurality of substrates is oriented along the field curvature.

* * * * *